US007567787B2

(12) United States Patent  (10) Patent No.: US 7,567,787 B2
Kuo et al.  (45) Date of Patent: Jul. 28, 2009

(54) APPARATUS AND METHOD OF FEEDING INTERNAL CALIBRATION SIGNAL THROUGH ELECTRO-STATIC DISCHARGE PROTECTION CIRCUITRY

(75) Inventors: Bing-Jye Kuo, Taipei (TW); Shou-Tsung Wang, Tainan Hsien (TW)

(73) Assignee: MediaTek Inc., Hsin-Chu (TW)

( * ) Notice: Subject to any disclaimer, the term of this patent is extended or adjusted under 35 U.S.C. 154(b) by 473 days.

(21) Appl. No.: 11/530,484

(22) Filed: Sep. 11, 2006

(65) Prior Publication Data
US 2008/0077346 A1   Mar. 27, 2008

(51) Int. Cl.
*H04B 1/26* (2006.01)
*H04B 17/00* (2006.01)
(52) U.S. Cl. ............... 455/217; 455/226.1; 455/324
(58) Field of Classification Search .............. 455/67.11, 455/67.14, 115.1, 115.2, 226.1–226.4, 323, 455/324, 117, 217; 361/91.1, 111
See application file for complete search history.

(56) References Cited

U.S. PATENT DOCUMENTS 6,757,147 B1 * 6/2004 Tong et al. ................ 361/111
2008/0062605 A1 * 3/2008 Tsai et al. ................. 361/104

\* cited by examiner

*Primary Examiner*—Nguyen Vo
(74) *Attorney, Agent, or Firm*—Winston Hsu

(57) ABSTRACT

An apparatus and method for internally calibrating a direct conversion receiver (DCR) through feeding a calibration signal via ESD protection circuitry is disclosed. The apparatus includes an internal signal generator for generating a calibration signal, a front-end input stage for receiving an RF signal at an input node, an ESD protection unit for protecting against electrostatic discharge, and a switch unit coupled to the ESD protection unit, for selectively passing a calibration signal to the front-end input stage, whereby the connection of the switch unit and the ESD protection unit means that when the DCR is operating in normal mode, the switch unit will not affect the noise performance and matching of the receiver.

25 Claims, 4 Drawing Sheets

APPARATUS AND METHOD OF FEEDING INTERNAL CALIBRATION SIGNAL THROUGH ELECTRO-STATIC DISCHARGE PROTECTION CIRCUITRY

BACKGROUND

The present invention relates to calibrating a direct conversion receiver, and more particularly to an apparatus and method for feeding an internal calibration signal through an electro-static discharge protection circuitry for a direct conversion receiver.

The basic principle of a superheterodyne receiver is to convert a band of RF signals to an intermediate frequency (IF) by mixing a first tunable local oscillator (LO) signal with the RF signals, and further convert the IF signals to a baseband frequency by mixing a second LO signal with the IF signals. A direct conversion receiver (DCR) is a receiver that directly converts RF signals to the baseband frequency in a single conversion step, without having to first convert the RF signals to an intermediate frequency. In a direct conversion receiver the LO signal is set to the same frequency as the desired RF channel, which means that the intermediate frequency is zero, or Direct Current (DC). Direct conversion receivers therefore require less external circuitry than other receivers and have the added advantages of lightweight and low cost.

A DCR has the well-known problem of DC offset associated with the process of down-converting the RF signal, however, which may initially be small but is amplified during signal processing, as the signal will pass through at least one gain stage. This amplified DC offset can cause saturation of the signal, at best decreasing sensitivity of the receiver, and at worst causing the receiver to fail. DC offset can also be created if there is leakage of the local oscillator signal to the front-end RF input. This can affect the linearity of the receiver. The less linear the front-end receiver is, the more the local oscillation signal will be affected by interference.

If the DCR is calibrated, the level of DC offset inherent in a received RF signal can be accurately measured, stored, and used to compensate for DC offset in future operations. Some receivers employ a method of external calibration for this purpose, which requires external circuitry, therefore negating the advantages the DCR has of simple circuitry. To solve this problem, a related art DCR uses a process of internal calibration, whereby an internal calibration signal is generated for adjusting DC offset of received signals.

Please refer to FIG. 1. FIG. 1 is a diagram of a related art DCR 10 that uses internal calibration. Please note that the diagram is a simplified diagram and only shows the essential parts. The DCR 10 comprises a front-end input stage 20 for receiving an RF signal, further comprising an antenna 22 for receiving the RF signal, a filter 24 for filtering the received RF signal, and a low noise amplifier 26, for amplifying the filtered RF signal; an internal signal generator 30, for generating a calibration signal; and a switch unit 40, selectively coupled to the internal signal generator 30 and the front-end input stage 20, for allowing the calibration signal to be fed to an input node of a processing unit 52 when the switch unit 40 is in the 'on' position and for disconnecting the internal signal generator 30 from the front-end input stage 20 when the DCR 10 is operating in normal mode.

When the DCR 10 is in calibration mode, i.e. the switch unit 40 is turned on and the calibration signal is passed to the processing unit 52, the DC offset can be correctly calculated through following signal processing. When the switch unit 40 is turned off, although the switch unit 40 is not operational, the direct coupling of the switch unit 40 to the front-end input stage 20 will cause some parasitic resistance and parasitic capacitance to be present in the DCR 10. The parasitic resistance introduces thermal noise into the circuit, which greatly affects the noise performance of the circuit and changes the receiver characteristics. The parasitic capacitance affects the input matching condition of the front-end circuit. The performance of the related art DCR 10 is thus degraded.

SUMMARY

It is therefore one of the objectives of the present invention to provide a DCR with internal calibration utilizing ESD protection circuitry for eliminating the extra parasitic resistance and parasitic capacitance, to solve the above-mentioned problem.

Briefly described, a first embodiment of the present invention comprises a front-end input stage for receiving and amplifying an RF signal at an input node; an electrostatic discharge (ESD) protection circuit, for protecting the Direct Conversion Receiver from ESD pulses, where the ESD protection circuit comprises a plurality of diodes connected in series between two voltage supply rails; an internal signal generator for generating a calibration signal; a processing unit for processing the RF signal and for calculating the DC offset of said signal; and a switch unit comprising a MOS transistor, coupled to the internal signal generator and the ESD protection circuit, for selectively passing the calibration signal to the front-end input stage by means of a control signal connected to the switch unit, so the switch unit is not directly connected to the front-end input stage of the DCR.

A second embodiment of the present invention is disclosed. Briefly described, the embodiment comprises a front-end input stage for receiving and amplifying an RF signal at an input node; an electrostatic discharge (ESD) protection circuit, for protecting the Direct Conversion Receiver from ESD pulses, where the ESD protection circuit comprises at least one diode and a switch unit connected in series between two voltage supply rails, and the switch unit is a MOS transistor for passing a calibration signal to the front-end input stage when the DCR is operating in calibration mode and for protecting the DCR from ESD pulses when the DCR is operating in normal mode by means of a control signal input to the switch; a processing unit for processing the received RF signal from the front-end input stage and for calculating the DC offset of said signal; and an internal signal generator, connected to the switch unit, for generating the calibration signal; wherein when the DCR is operating in normal mode, the switch unit functions as a diode, so the connection of the switch to the front-end input stage does not introduce parasitic resistance and parasitic capacitance to the circuit.

A method for calibrating a DCR by means of an internal calibration signal is also disclosed. Briefly described, the method comprises generating an internal calibration signal by means of an internal signal generator; selectively passing the calibration signal through an ESD protection circuit to a front-end input stage by means of a switch unit coupled to a control signal; processing the signal such that the DC offset is measured and the value stored, the stored value being used to compensate for DC offset when the receiver is operating in normal mode. The connection of devices so that the signal is passed through the ESD protection circuit before being input to the front end ensures that the presence of the switch will not introduce parasitic resistance and parasitic capacitance to the DCR when the switch is not operational, i.e. when the DCR is not operating in a calibration mode.

It is an advantage of the present invention that the presence of the switch unit does not affect the performance of the receiver when the receiver is operating under normal mode. It is a further advantage that a calibration signal can be generated internally through the connection of the switch unit and the ESD protection circuit, without requiring complex circuitry.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
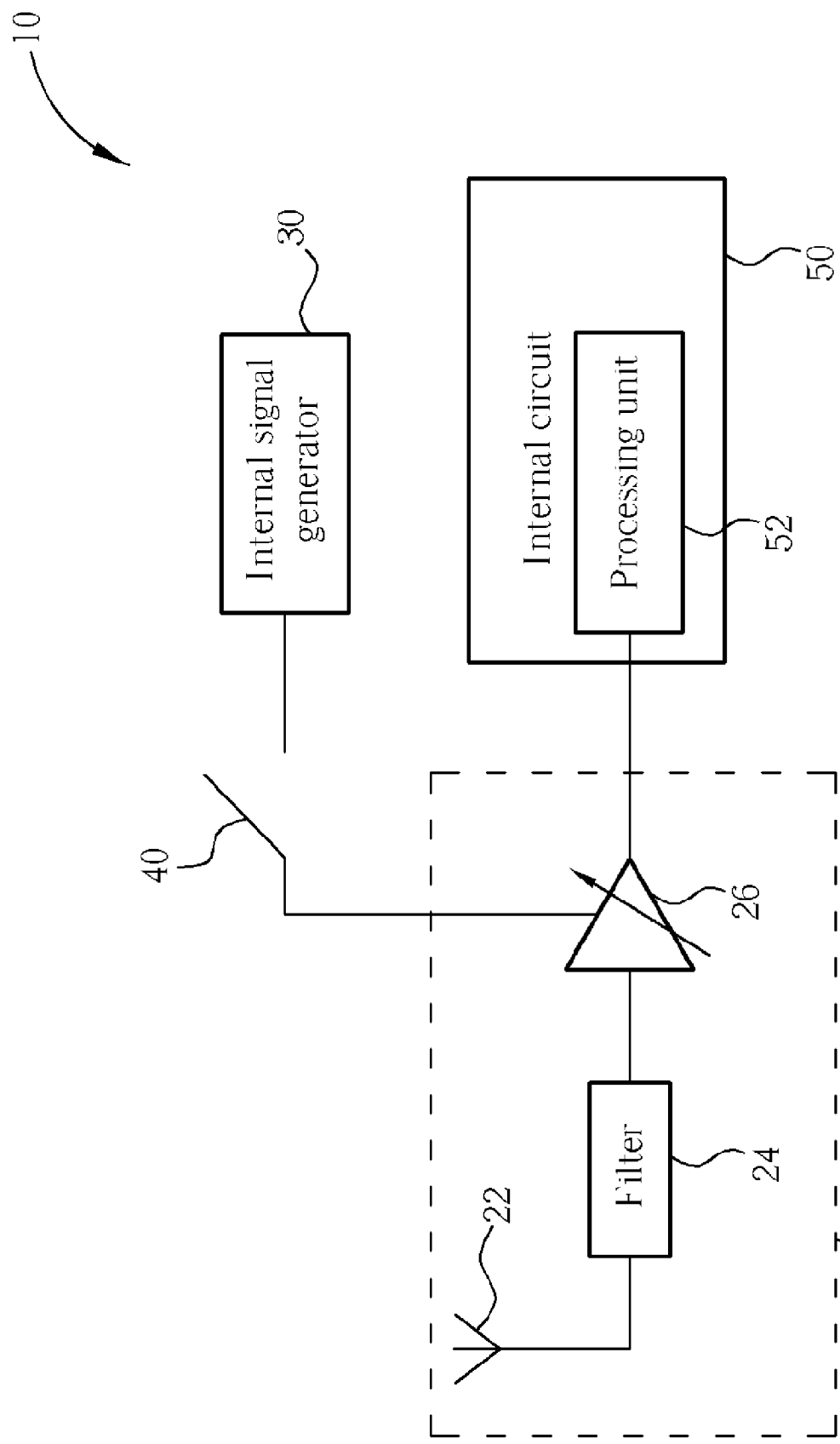
FIG. 1 is a diagram of a direct conversion receiver according to the related art.
Figure 2:
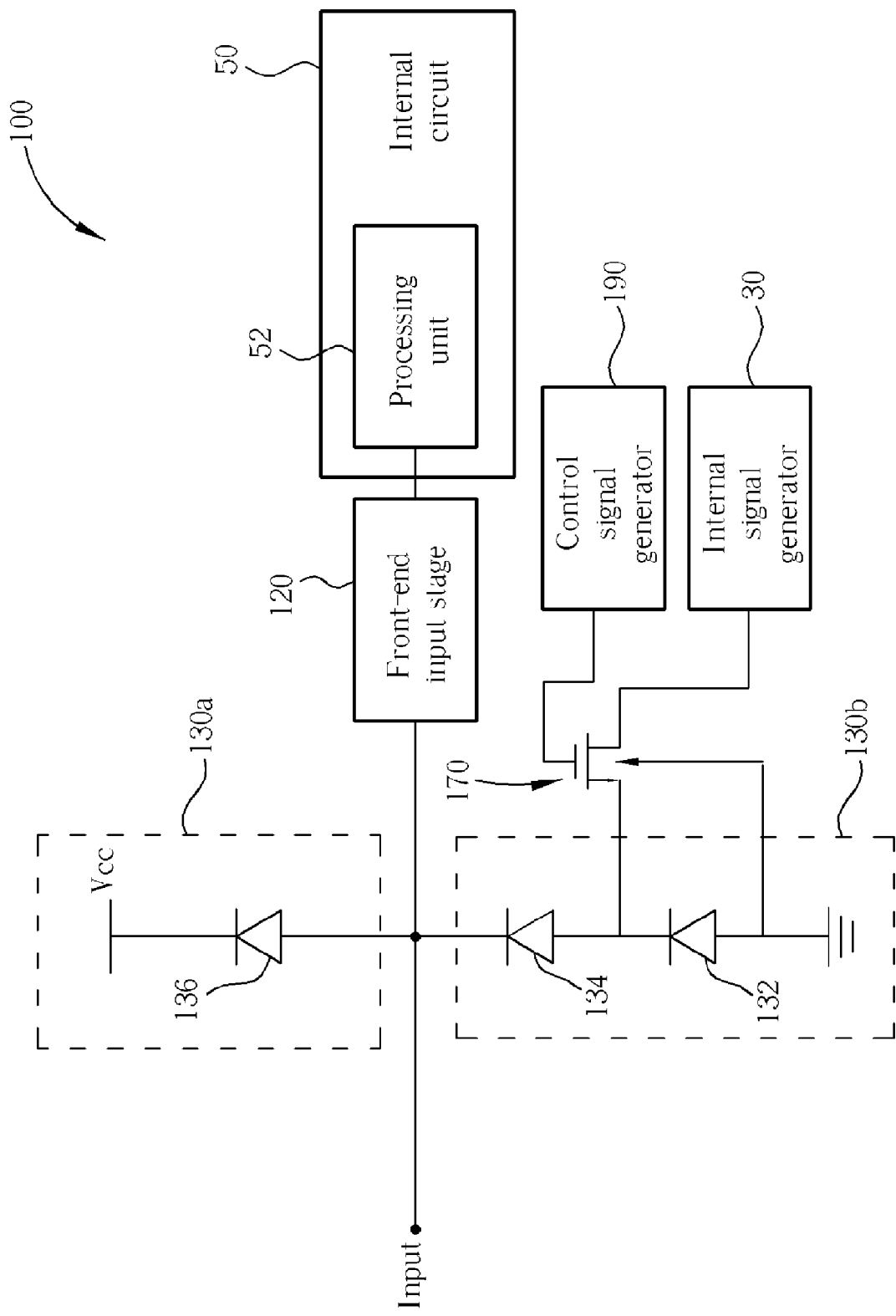
FIG. 2 is a diagram of a direct conversion receiver according to a first embodiment of the present invention.

Please refer to FIG. 2. FIG. 2 is a diagram of a DCR 100 according to a first embodiment of the present invention. The DCR 100 comprises a front-end input stage 120 for receiving an RF signal at an input node; a plurality of electrostatic discharge (ESD) protection units 130a, 130b collectively comprising three diodes 132, 134, 136 connected in series between two voltage supply rails, $V_{cc}$ and ground; an internal circuit 50 including a processing unit 52; an internal signal generator 30; a control signal generator 190; and a switch unit 170. The front-end input stage 120 has the same functionality as that of the above-mentioned related art front-end input stage 20. These ESD protection units 130a, 130b together locate at the input of the front-end input stage 120 to build the ESD protection circuit for the DCR 100 to dissipate ESD pulses which might damage the front-end input stage 120 and the internal circuit 50. The switch unit 170 is connected to the control signal generator 190 and the internal signal generator 30. The internal circuit 50 is coupled to the front-end input stage 120. The processing unit 52 is used to process signal(s) from the front-end input stage 120. For example, the processing unit 52 is capable of estimating DC offset by processing the calibration signal received from the internal signal generator 30 in calibration mode and processing the RF signal received from the front-end input stage 120 in normal mode.

The ESD protection unit 130b consists of one n+/p-well diode 132 and one p+/n-well diode 134, connected in series between ground and the front-end input stage 120, and the ESD protection unit 130a has a p+/n-well diode 136 connected between the front-end input stage 120 and a positive voltage supply rail $V_{cc}$. Please note that more than three diodes may be used in the ESD protection units 130a, 130b and the number of diodes in this embodiment is merely meant to be an illustration and not a limitation of the present invention. The switch unit 170 is implemented by an NMOS transistor, having a gate coupled to the control signal generator 190, a drain coupled to the internal signal generator 30, a source coupled to a p+region of the second p+/n-well diode 134, and a body coupled to the ground. The ESD protection units 130a, 130b are designed to protect the DCR 100 from the effects of electrostatic discharge by utilizing the series of diodes 132, 134, 136 connected between two voltage supply rails, in order to discharge positive ESD pulses from the input to the positive supply rail via the diode 136 and discharge negative ESD pulses from ground to the input via the diodes 132, 134. The control signal generator 190 is utilized for controlling the switch unit 170 to selectively pass the calibration signal to the front-end input stage 120 through the switch unit 170 and the p+/n-well diode 134. When a control signal generated from the control signal generator 190 having a high logic level is input to the gate, the switch unit 170 can allow the calibration signal to flow from the drain to the source. However, when the control signal has a low logic level or the control signal generator 190 generates no control signal, there is insufficient voltage built up at the gate for inducing the conductive channel in the switch unit (NMOS transistor) 170. Therefore, any signals outputted from the internal signal generator 30 are blocked from flowing from the drain to the source, that is, the calibration signal cannot be passed to the front-end input stage 120. During normal mode, i.e. when the calibration signal is not being passed, the switch unit 170 is not operating. In the related art, the presence of the switch during normal mode causes some parasitic resistance and parasitic capacitance to be present in the DCR, affecting the noise performance and matching of the receiver. However, in the present invention, the switch unit 170 is connected to the front-end input stage 120 through the ESD protection unit 130b. The parasitics of the diodes in the ESD protection units 130a, 130b that discharge current are the inherent parasitics and the switch 170 does not contribute additional parasitics to the input node.

Figure 3:
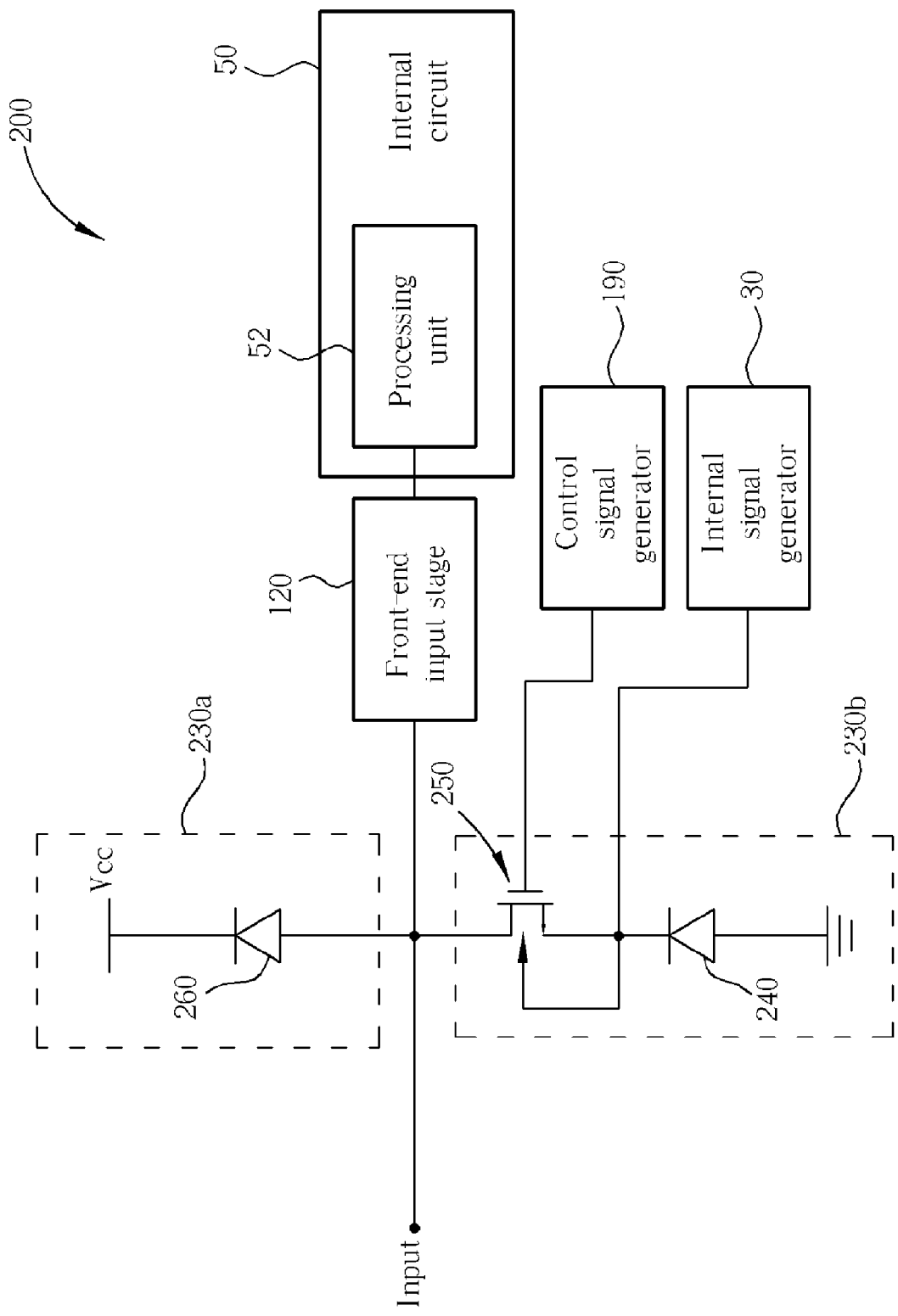
FIG. 3 is a diagram of a direct conversion receiver according to a second embodiment of the present invention.

Please refer to FIG. 3. FIG. 3 is a diagram of a DCR 200 according to a second embodiment of the present invention. The DCR 200 comprises a front-end input stage 120 for receiving an RF signal at an input node; a plurality of electrostatic discharge (ESD) protection units 230a, 230b comprising two diodes 240, 260 and a switch unit 250 connected in series between two voltage supply rails, $V_{cc}$ and ground; an internal circuit 50 including a processing unit 52 used to process incoming signals; a control signal generator 190; and an internal signal generator 30. The internal circuit 50 is coupled to the front-end input stage 120.

The key difference between the DCRs 100 and 200 is the configuration of the ESD protection circuitry. In this embodiment, the ESD protection unit 230b comprises the n+/p-well diode 240 and the switch unit 250 connected in series between ground and the internal circuit 50, and the ESD protection unit 230a has a p+/n-well diode 260 connected between the front-end input stage 120 and a positive voltage supply rail $V_{cc}$. Please note that more than two diodes may be used in each ESD protection unit 230a, 230b and the number of diodes in this embodiment is merely meant to be an illustration and not a limitation of the present invention. The switch unit 250 in this embodiment is implemented by an NMOS transistor having a gate coupled to the control signal generator 190 for receiving a control signal generated from the control signal generator 190, a source coupled to the calibration signal, a drain coupled to the front-end input stage 120, and a body coupled to the source. In this embodiment, the switch unit 250 is part of the ESD protection unit 230b. When the DCR 200 is in calibration mode, the control signal having a high logic level is passed from the control signal generator 190 to the gate of the NMOS transistor (switch unit 250) in order to induce a conductive channel between the drain and the source, allowing current to flow, and the calibration signal to be passed. When the DCR 200 is not in calibration mode, the switch unit 250 functions as a pure diode, with the gate in a low logic level. The NMOS in this embodiment has a lateral p-guard-ring/n+ drain, and it cannot pass the calibration signal when the gate of the NMOS transistor (switch unit 250) is in a low logic level. As the switch unit 250 acts as a switch in calibration mode while acts as a diode in normal mode, the presence of the switch unit 250 will not contribute additional parasitics to the DCR 200 under normal mode.

Figure 4:
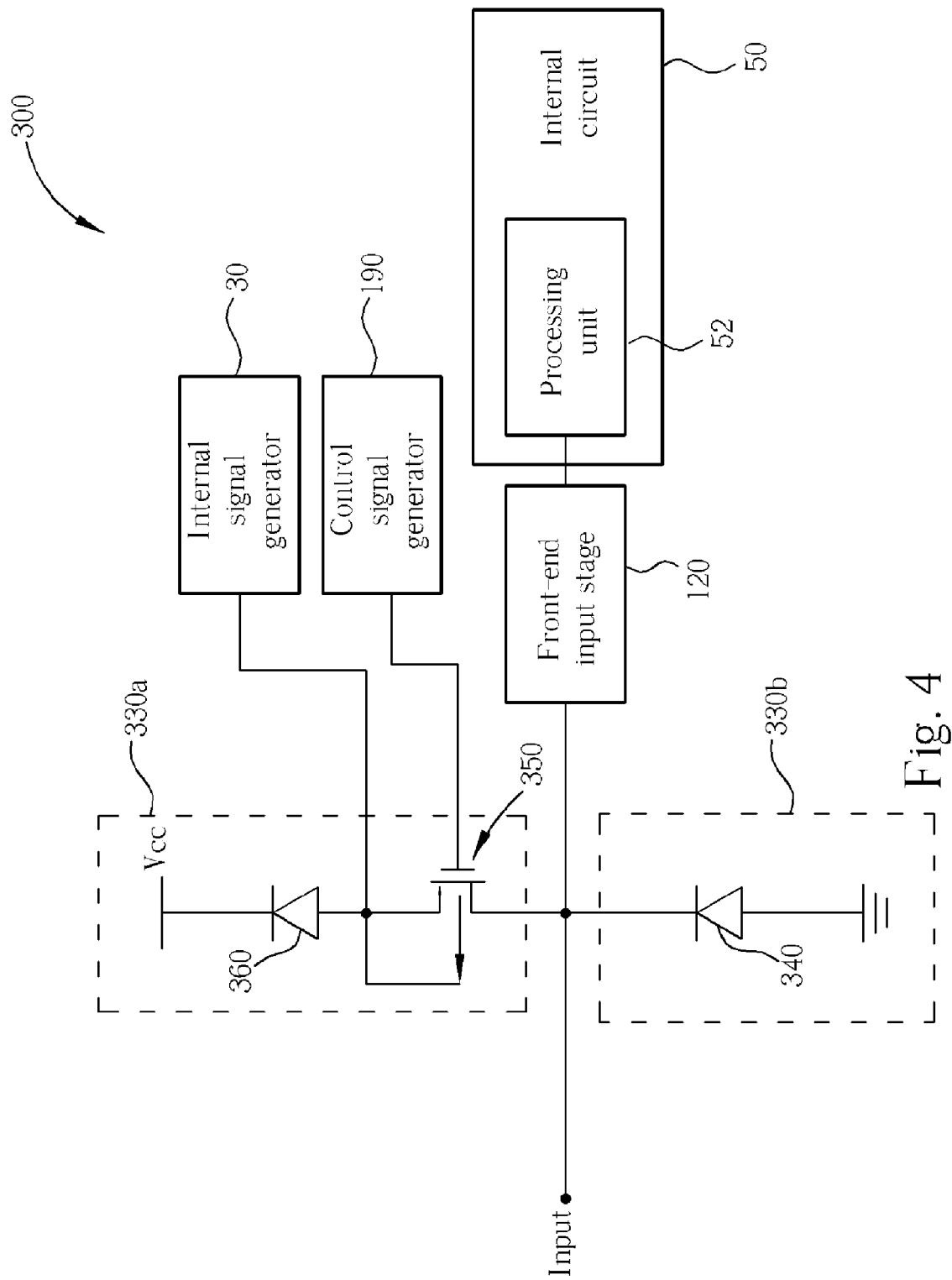
FIG. 4 is a diagram of a direct conversion receiver according to a third embodiment of the present invention.

Please refer to FIG. 4. FIG. 4 is a diagram of a DCR 300 according to a third embodiment of the present invention. The DCR 300 comprises a front-end input stage 120; a plurality of electro-static discharge (ESD) protection units 330a, 330b comprising two diodes 340, 360 and a switch unit 350 connected in series between two voltage supply rails, $V_{cc}$ and ground; an internal circuit 50 including a processing unit 52 used to process incoming signals; a control signal generator 190; and an internal signal generator 30. The internal circuit 50 is coupled to the front-end input stage 120.

In this embodiment, the ESD protection unit 330a comprises the diode 360 and the switch unit 350 connected in series between a positive voltage supply rail $V_{cc}$ and the front-end input stage 120, and the ESD protection unit 330b has the n+/p-well diode 340 connected between the front-end input stage 120 and ground. Please note that more than two diodes may be used in each of the ESD protection units 330a, 330b and the number of diodes in this embodiment is merely meant to be an illustration and not a limitation of the present invention. The switch unit 350 in this embodiment is implemented by a PMOS transistor, having a gate coupled to the control signal generator 190 for receiving a control signal, a source coupled to the calibration signal, a drain coupled to the front-end input stage 120, and a body coupled to the source. In this embodiment, the switch unit 350 is part of the ESD protection unit 330a. The operation of this embodiment is the same as the previous embodiment except that the NMOS transistor has been replaced with a PMOS transistor, which is connected between the front-end input stage and $V_{cc}$. The calibration signal is selectively passed to the front-end input stage 120 by utilizing the control signal having a low logic level input to the gate of the PMOS transistor (switch unit 350). When the DCR 300 is not in calibration mode, the switch unit 350 functions as a pure diode, with the gate in a high logic level. As detailed in the previous embodiment, the switch unit 350 acts as a switch in calibration mode while acting as a diode in normal mode. Therefore, the presence of the switch unit 350 will not contribute additional parasitics to the DCR 300 under normal mode Please note that the calibration signal can be generated in many ways. A first method involves dividing a VCXO output $F_{VCXO}$ by 4 and up-converting the output $F_{VCXO}/4$ and a VCO output to generate a calibration signal $F_{VCO}+F_{VCXO}/4$. A second method is to up-convert $F_{VCO}$ and the output from a ring oscillator to generate a calibration signal $F_{VCO}+F_{ring}$. A third method is to up-convert $F_{VCO}$ and the output from a filter-calibration-oscillator $F_{cal}$ to generate a calibration signal $F_{VCO}+F_{cal}$. A fourth method is simply to take the output of the VCO as the calibration signal. Since these methods are well known to those skilled in the art, further description is omitted for brevity.

The connection of the switch unit to the ESD protection circuit negates the negative effects caused by the related art direct connection of the switch unit to the front-end input stage, giving the direct conversion receiver higher performance. In the first embodiment of the present invention, the input node will not suffer from extra parasitic capacitance caused by the presence of the switch unit. In the second and third embodiments of the present invention, the switch unit serves as a switch in calibration while acts as a diode in normal mode, and therefore does not affect the noise performance and matching of the front-end input stage. When the switch unit is in the 'on' position, i.e. the receiver is in calibration mode, the calibration signal can be passed to the front-end input stage of the receiver. When the switch unit is in the 'off' position, i.e. the receiver is operating in normal mode, the connection of the switch unit and the ESD protection unit allows the receiver to operate as though no switch were present.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic apparatus with calibration, comprising:
    a processing circuit for processing an input signal received at an input node;
    at least an electro-static discharge (ESD) protection unit, coupled between the input node and a voltage supply node, for dissipating ESD pulses at the input node; and
    a switch unit, coupled to the ESD protection unit and not directly connected to the input node of the processing unit, for receiving a calibration signal and for selectively passing the calibration signal as the input signal to the processing circuit through the ESD protection unit according to a control signal.

2. The electronic apparatus of claim 1, wherein the input signal is an RF signal.

3. The electronic apparatus of claim 2, being a direct conversion receiver (DCR) for directly down-converting the RF signal into a baseband signal.

4. The electronic apparatus of claim 1, wherein the processing circuit comprises:
    an internal signal generator, coupled to the switch unit, for generating the calibration signal.

5. The electronic apparatus of claim 1, wherein the ESD protection unit comprises a plurality of cascode diodes, and the switch unit is directly connected to a p-region of a diode of the cascode diodes.

6. The electronic apparatus of claim 5, wherein the switch unit is an NMOS transistor having a gate used for receiving the control signal, a first terminal connected to the p-region of the diode, and a second terminal used for receiving the calibration signal.

7. An electronic apparatus with calibration, comprising:
    a processing circuit for processing an input signal received at an input node;
    at least an electro-static discharge (ESD) protection unit, coupled between the input node and a voltage supply node, for dissipating ESD pulses at the input node, the ESD protection unit comprising:
        a MOS transistor, comprising:
            a gate, coupled to a control signal;
            a first terminal, coupled to the input node;
            a body; and
            a second terminal, coupled to the body; and
        at least a diode coupled to the MOS transistor in series;
    wherein the MOS transistor receives a calibration signal inputted to the second terminal and selectively passes the calibration signal as the input signal to the processing circuit according to the control signal.

8. The electronic apparatus of claim 7, wherein the input signal is an RF signal.

9. The electronic apparatus of claim 8, being a direct conversion receiver (DCR) for directly down-converting the RF signal into a baseband signal.

10. The electronic apparatus of claim 7, wherein the processing circuit comprises:
an internal signal generator, coupled to the second terminal of the MOS transistor, for generating the calibration signal.

11. The electronic apparatus of claim 7, wherein the MOS transistor is a PMOS transistor, the first terminal is a drain, and the second terminal is a source.

12. The electronic apparatus of claim 7, wherein the MOS transistor is an NMOS transistor, the first terminal is a drain, and the second terminal is a source.

13. A method for calibrating an electronic apparatus, comprising:
providing a processing circuit, and utilizing the processing circuit to process an input signal received at an input node;
coupling at least an electro-static discharge (ESD) protection unit between the input node and a voltage supply node, and utilizing the ESD protection circuit to dissipate ESD pulses at the input node;
coupling a switch unit to the ESD protection unit;
in a calibration mode, switching on the switch unit for passing a calibration signal as the input signal to the processing circuit through the ESD protection unit; and
in a normal mode, switching off the switch unit according to a control signal.

14. The method of claim 13, wherein the input signal is an RF signal.

15. The method of claim 14, wherein the electronic apparatus is a direct conversion receiver (DCR) for directly down-converting the RF signal into a baseband signal.

16. The method of claim 13, wherein the step of providing the processing circuit further comprises:
providing the processing circuit with an internal signal generator, and utilizing the internal signal generator for generating the calibration signal.

17. The method of claim 13, further comprising:
providing the ESD protection unit with a plurality of cascode diodes; and
the step of coupling the switch unit to the ESD protection unit further comprises:
directly connecting the switch unit to a p-region of a diode of the cascode diodes.

18. A method for calibrating an electronic apparatus, comprising:
providing a processing circuit, and utilizing the processing circuit to process an input signal received at an input node;
coupling at least an electro-static discharge (ESD) protection unit between the input node and a voltage supply node, for dissipating ESD pulses at the input node, the ESD protection unit comprising:
a MOS transistor, comprising:
a gate, coupled to a control signal;
a first terminal, coupled to the input node;
a body; and
a second terminal, coupled to the body; and
at least a diode coupled to the MOS transistor in series;
in a calibration mode, switching on the MOS transistor for passing a calibration signal inputted into the second terminal as the input signal to the processing circuit according to the control signal; and
in a normal mode, switching off the MOS transistor according to the control signal.

19. The method of claim 18, wherein the input signal is an RF signal.

20. The method of claim 19, wherein the electronic apparatus is a direct conversion receiver (DCR) for directly down-converting the RF signal into a baseband signal.

21. The method of claim 18, wherein the step of providing the processing circuit further comprises:
providing the processing circuit with an internal signal generator, and utilizing the internal signal generator for generating the calibration signal.

22. An electronic apparatus, comprising:
a processing circuit for processing an input signal received at an input node;
at least an electro-static discharge (ESD) protection unit, coupled between the input node and a voltage supply node, for dissipating ESD pulses at the input node; and
a switch unit, coupled to the ESD protection unit and not directly connected to the input node of the processing unit, for receiving an internal signal from an internal signal generator and for selectively passing the internal signal as the input signal to the processing circuit through the ESD protection unit according to a control signal.

23. The electronic apparatus of claim 22, being a direct conversion receiver (DCR) for directly down-converting an RF signal into a baseband signal, wherein the input signal is the RF signal, and the internal signal is a signal used for calibration.

24. An electronic apparatus, comprising:
a processing circuit for processing an input signal received at an input node;
at least an electro-static discharge (ESD) protection unit, coupled between the input node and a voltage supply node, for dissipating ESD pulses at the input node, the ESD protection unit comprising:
a MOS transistor, comprising:
a gate, coupled to a control signal;
a first terminal, coupled to the input node;
a body; and
a second terminal, coupled to the body; and
at least a diode coupled to the MOS transistor in series;
wherein the MOS transistor receives an internal signal inputted to the second terminal from an internal signal generator and selectively passes the internal signal as the input signal to the processing circuit according to the control signal.

25. The electronic apparatus of claim 24, being a direct conversion receiver (DCR) for directly down-converting an RF signal into a baseband signal, wherein the input signal is the RF signal, and the internal signal is a signal used for calibration.

* * * * *